US008217820B2

(12) United States Patent
Chen

(10) Patent No.: US 8,217,820 B2
(45) Date of Patent: Jul. 10, 2012

(54) USING MULTI-LEVEL PULSE WIDTH MODULATED SIGNAL FOR REAL TIME NOISE CANCELLATION

(75) Inventor: Walter Y Chen, Lathrop, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 86 days.

(21) Appl. No.: 12/939,924

(22) Filed: Nov. 4, 2010

(65) Prior Publication Data

US 2012/0114033 A1 May 10, 2012

(51) Int. Cl.
*H03M 1/82* (2006.01)

(52) U.S. Cl. ........................................ 341/152; 341/143

(58) Field of Classification Search .................. 341/143, 341/152
See application file for complete search history.

(56) References Cited

U.S. PATENT DOCUMENTS

| | | | | |
|---|---|---|---|---|
| 4,494,074 | A | 1/1985 | Bose | |
| 6,594,309 | B1 | 7/2003 | Botti et al. | |
| 6,674,383 | B2 * | 1/2004 | Horsley et al. | 341/152 |
| 6,727,832 | B1 * | 4/2004 | Melanson | 341/143 |
| 7,724,161 | B1 * | 5/2010 | Cyrusian | 341/53 |

OTHER PUBLICATIONS

Doom, T.S., Van Tuijl, E, Schinkel, D., Annema, A.J., Berkhout, M., and Nauta, B., "An Audio FIR-DAC in a BCD Process for High Power Class-D Amplifiers," Jan. 2005, pp. 459-462, IEEE, Proceedings of ESSCIRC, Grenoble, France, 2005.

Cowan, G and Tsividis, Y., "Analog and Digital Continuous-Time Computation and Signal Processing,"Jan. 2009, pp. 1-42, Concordia University, Columbia Integrated Systems Laboratory, Columbia University, CMOSET 2009.

Iwata, Atsushi and Nagata, Makoto, "A Concept of Analog-Digital Merged Circuit Architecture for Future VLSI" Aug. 20, 1995, pp. 83-96, Analog Integrated Circuits and Signal Processing, vol. 11, 1996.

Schell, Bob and Tsividis, Yannis, A Continuous-Time ADC/DSP/DAC System With No Clock and With Activity-Dependent Power Dissipation, Nov. 2008, pp. 2472-2481, IEEE Journal of Solid-State Circuits, vol. 43, No. 11, 2008.

Li, Yee William, Shepard, Kenneth L and Tsividis, Yannis P., "A Continuous-Time Programmable Digital FIR Filter," Nov. 2006, pp. 2512-2020, IEEE Journal of Solid-State Circuits, vol. 41, No. 11, 2006.

Li, Y.W., Shepard, K.L. and Tsividis, Y.P., "Continuous-Time Digital Signal Processors," Jan. 2005, pp. 1-6, 11th IEEE International Symposium on Asynchronous Circuits and Systems, 2005.

* cited by examiner

*Primary Examiner* — Khai M Nguyen
(74) *Attorney, Agent, or Firm* — Haverstock & Owens LLP

(57) ABSTRACT

A mixed signal processing circuit includes an analog to PWM converting circuit and a finite impulse response (FIR) filter having a multiple output tapped delay line and a summing and integration circuit. The mixed signal processing circuit converts an input analog signal to a PWM signal, forms a multi-level PWM signal from the PWM signal and one or more delayed versions of the PWM signal, and converts the multi-level PWM signal to an output analog signal. The analog to PWM converting circuit is implemented using a triangle waveform generator and a comparator. The FIR filter is implement using a resistive network to apply scaling coefficients of the FIR filter. The mixed signal processing circuit can be implemented within a noise cancellation headphone to generate a noise cancelling signal or generally in applications that would be benefitted from the combination of analog input/output and digital filter techniques.

20 Claims, 5 Drawing Sheets

USING MULTI-LEVEL PULSE WIDTH MODULATED SIGNAL FOR REAL TIME NOISE CANCELLATION

FIELD OF THE INVENTION

The present invention relates to the field of mixed signal processing. More particularly, the present invention relates to the field of using multi-level pulse width modulated signal for real time noise cancellation.

BACKGROUND OF THE INVENTION

Signal processing is directed to performing operations on or analysis of signals. Signals are analog or digital electrical representations of time-varying or spatial-varying physical quantities. Digital signal processing and analog signal processing are sub-fields of signal processing. Digital signal processing is for signals that have been digitized. Analog signal processing is for signals that have not been digitized. More particularly, digital signal processing represents signals by a sequence of numbers or symbols and the processing of these signals. Analog signal processing is any signal processing conducted on analog signals by analog means. “Analog” indicates something that is mathematically represented as a set of continuous values. This differs from “digital” which uses a series of discrete quantities to represent signal. Mixed signal processing includes elements of both analog signal processing and digital signal processing. Examples of mixed signal processing include, but are not limited to, comparators, timers, phase-locked loops, analog-to-digital converters, and digital-to-analog converters.

A fundamental distinction between different types of signals is between continuous-time signals and discrete-time signals. In the mathematical abstraction, the domain of a continuous-time signal is the set of real numbers or some interval thereof, whereas the domain of a discrete-time signal is the set of integers or some interval thereof. Discrete-time signals often arise via sampling of continuous-time signals. A continuous-time signal is a varying signal over a continuous time domain. A discrete-time signal has a countable time domain, like the natural numbers.

Signal processing systems can be either discrete or continuous in amplitude or time. Quantizers are used to convert signals from continuous to discrete amplitude, and samplers are used to convert signals from continuous to discrete time. Conventional digital signal processing systems are discrete in time and discrete in amplitude, but such systems suffer from aliasing and quantization noise. Conventional analog systems that process signals continuously in time and amplitude do not suffer from aliasing and quantization noise, but instead have high sensitivity to component tolerances and matchings, comparatively low dynamic ranges, and limited and difficult reconfigurability. Conventional systems that are discrete in time but continuous in amplitude, such as switched-capacitor circuits, also suffer from aliasing. Systems that are discrete in amplitude but continuous in time remain largely unexplored.

Signal processing has many applications. One such application is noise cancellation headphones which can be used to improve the quality of listening to an audio device in noisy environments. Many conventional high-end noise canceling headphones use analog components. When canceling an analog signal, a noise canceling analog signal is applied where the noise canceling analog signal is an inverse of the analog signal. The residue is the error (remaining signal) after the inverse signal is applied. The amount of residue is a function of the phase delay between the original analog signal to be canceled and the noise canceling analog signal. For effective noise cancellation to be achieved, real-time canceling is necessary. If the noise canceling analog signal is not applied within a relatively small phase delay, such as 10 degrees, much of the noise cancelling is lost. If the phase delay is less than this threshold, a good cancellation level is achieved. The higher the frequency of the signal to be cancelled, the more difficult it is to cancel the signal.

Current offerings use 100’s of analog components at relatively high prices, approximately $300. A digital approach is feasible, but often with poor results or high costs because of the very low delay requirement for real-time noise cancellation. Digital filters used within noise cancellation circuits can provide more design flexibility than analog filters, but digital filters introduce delays and consume more power. Specifically, analog-to-digital conversion and digital-to-analog conversion needed in digital processing of analog signals require time and therefore introduce time delays. In applications that are real-time dependent, such as noise cancellation, such delays are prohibitive.

SUMMARY OF THE INVENTION

Embodiments of a mixed signal processing circuit include an analog to PWM converting circuit and a finite impulse response (FIR) filter. The FIR filter includes a multiple output tapped delay line and a summing and integration circuit. The mixed signal processing circuit is configured for converting an input analog signal to a PWM signal, forming a multi-level PWM signal from the PWM signal and one or more delayed versions of the PWM signal, and converting the multi-level PWM signal to an output analog signal. In some embodiments, the analog to PWM converting circuit is implemented using a triangle waveform generator and a comparator. In some embodiments, the FIR filter is implement using a PWM delay line and a resistive network to apply scaling coefficients of the FIR filter. The mixed signal processing circuit can be implemented within a noise cancellation headphone to generate a noise cancelling signal. In general, the mixed signal processing circuit can be used in applications that would be benefitted from the combination of analog input/output and digital filter techniques.

In one aspect, a signal processing circuit is disclosed. The signal processing circuit includes a converting circuit configured to receive an input analog signal and to output a pulse width modulated signal corresponding to the analog signal; a delay line coupled to the converting circuit to receive the pulse width modulated signal, wherein the delay line comprises one or more delay line taps, each delay line tap configured to output a delayed version of the pulse width modulated signal; a scaling circuit coupled to the converting circuit and to the one or more delay line taps, where the scaling circuit is configured to scale the pulse width modulated signal and each of the one or more delayed versions of the pulse width modulated signal, thereby forming multiple scaled pulse width modulated signals; and a summing and integration circuit coupled to the scaling circuit, wherein the summing and integration circuit is configured to receive the multiple scaled pulse width modulated signals, to sum the multiple scaled pulse width modulated signals into a multiple-level pulse width modulated signal, and to convert the multiple-level pulse width modulated signal to an output analog signal.

In some embodiments, the converting circuit comprises a comparator and a triangle waveform generator, wherein the comparator is configured to compare the input analog signal and a triangle waveform received from the triangle waveform generator, and to output the pulse width modulated signal in response to the comparison. In some embodiments, a period of the pulse width modulated signal corresponds to a period of the triangle waveform, and a duty cycle of a specific period of the pulse width modulated signal corresponds to an amplitude of the input analog signal during a same period of the triangle waveform. In some embodiments, a first delayed version of the pulse width modulated signal output from a first delay line tap is delayed relative to the pulse width modulated signal by the period of the pulse width modulated signal, and each successive delayed version of the pulse width modulated signal output from each successive delay line tap is successively delayed by the period of the pulse width modulated signal. In some embodiments, the scaling circuit comprises a resistor network. In some embodiments, the summing and integrations circuit comprises an operational amplifier. In some embodiments, the summing and integration circuit comprises one or more summing circuits. In some embodiments, the delay line, the scaling circuit, and the summing and integration circuit form a finite impulse response filter. In some embodiments, the finite impulse response filter is programmable. In some embodiments, the signal processing circuit is a mixed signal processing circuit. In some embodiments, the mixed signal processing circuit is a multi-level pulse width modulation signal processing circuit.

In another aspect, a noise cancellation headphone is disclosed. The noise cancellation headphone comprises a microphone configured to detect ambient noise and to generate an input analog signal corresponding to the ambient noise; a signal processing circuit coupled to the microphone; and a speaker coupled to the signal processing circuit, wherein the speaker is configured to generate audio in response to the output analog signal. The signal processing circuit comprises a converting circuit configured to receive the input analog signal and to output a pulse width modulated signal corresponding to the analog signal; a delay line coupled to the converting circuit to receive the pulse width modulated signal, wherein the delay line comprises one or more delay line taps, each delay line tap configured to output a delayed version of the pulse width modulated signal; a scaling circuit coupled to the converting circuit and to the one or more delay line taps, where the scaling circuit is configured to scale the pulse width modulated signal and each of the one or more delayed versions of the pulse width modulated signal, thereby forming multiple scaled pulse width modulated signals; and a summing and integration circuit coupled to the scaling circuit, wherein the summing and integration circuit is configured to receive the multiple scaled pulse width modulated signals, to sum the multiple scaled pulse width modulated signals into a multiple-level pulse width modulated signal, and to convert the multiple-level pulse width modulated signal to an output analog signal, wherein the output analog signal substantially cancels a portion of the input analog signal.

In another aspect, a method of signal processing is disclosed. The method includes receiving an input analog signal; converting the analog signal to a pulse width modulated signal; generating one or more time delayed versions of the pulse width modulated signal; scaling the pulse width modulated signal and each of the one or more delayed versions of the pulse width modulated signal, thereby forming multiple scaled pulse width modulated signals; summing the multiple scaled pulse width modulated signals to form a multiple-level pulse width modulated signal; and converting the multiple-level pulse width modulated signal to an output analog signal.

BRIEF DESCRIPTION OF THE DRAWINGS

Embodiments of the mixed signal processing circuit are described relative to the several views of the drawings. Where appropriate, the same reference numeral will be used to represent the same or like elements.

DETAILED DESCRIPTION OF THE EMBODIMENTS

Figure 1:
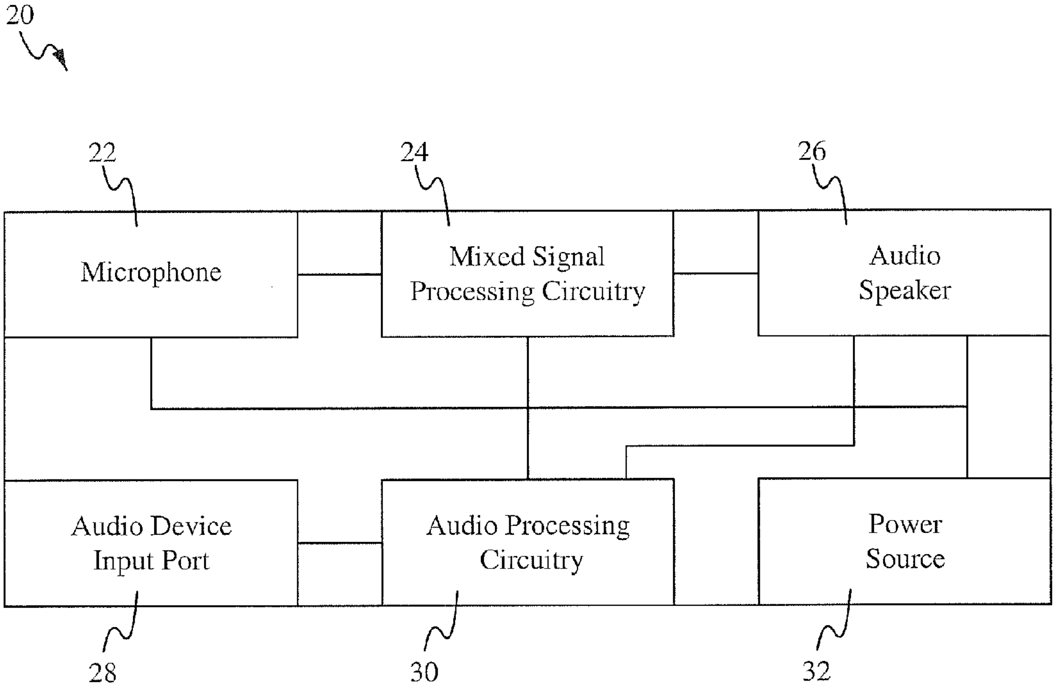
FIG. 1 illustrates a simplified block diagram of an exemplary application of the mixed signal processing circuit within a noise cancellation headphone.

Embodiments of the present application are directed to a mixed signal processing circuit. Those of ordinary skill in the art will realize that the following detailed description of the mixed signal processing circuit is illustrative only and is not intended to be in any way limiting. Other embodiments of the mixed signal processing circuit will readily suggest themselves to such skilled persons having the benefit of this disclosure.

Reference will now be made in detail to implementations of the mixed signal processing circuit as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The mixed signal processing circuit and the principles related thereto use a mixed signal approach, which has the flexibility of digital filters with a minimum delay. The mixed signal processing circuit and related principles can improve performances and reduce die sizes of mixed signal chips where analog filters are necessary. In general, many of the advantages of digital signal processing can be realized using the mixed signal processing circuit. The mixed signal processing circuit and related principles enable analog-like precision and functionality on low geometry processes optimized for dense digital circuits.

In some embodiments, the mixed signal processing circuit is used to implement a high performance and low cost noise cancellation earphone/headphone chip. Using the mixed signal processing technique, a single chip noise cancelling solution with no external components can be provided at a very reasonable price. This approach makes affordable noise cancellation headphone products available while further improving the performance of high end noise cancellation headphone products.

Although described in terms of a noise cancelling application, the principles of the mixed signal processing circuit can be applied to other areas where the combination of analog input/output and digital filter techniques would be advantageous. Such applications include, but are not limited to, using the mixed signal processing circuit to improve the performance and to reduce the die size of DC to DC converters, using the mixed signal processing circuit principles in phase-locked loop (PLL) controllers, and using the mixed signal processing circuit principles in real time servo control systems to eliminate the use of fast analog to digital converters, fast digital to analog converters, and fast microprocessors.

In general, filters are used as signal conditioners. A filter functions by accepting an input signal, blocking specified frequency components, and passing the original signal minus those blocked components to the output. Filters are typically defined by their response to individual frequency components that constitute the input signal. This is referred to as the frequency response of the filter. An analog filter operates directly on the analog inputs and is built entirely with analog components, such as resistors, capacitors, and inductors. An example of an analog filter is a second order Bessel lowpass filter. A digital filter takes a digital input, gives a digital output, and consists of digital components. In an exemplary digital filtering application, software running on a digital signal processor (DSP) reads input samples from an analog to digital converter, performs mathematical manipulations dictated by the designed filter, and outputs the result via a digital to analog converter. Given the individual filter parameters, the filtering software defines the required signal processing equations and coefficients for implementation on the DSP.

A FIR filter is a filter structure used to implement a desired frequency response digitally. A FIR filter is typically implemented using a series of delays, multipliers, and adders to generate the filter output. The number of delays and the values of the coefficients used by the multipliers is dependent on the filter design corresponding to the desired frequency response.

The mixed signal processing circuit uses pulse width modulation (PWM) and multi-level PWM signals. Converting a real-time analog signal to a PWM signal results in a very small delay. By allowing the PWM signal to become multiple levels instead of binary, it is possible to add and scale the PWM signal and delayed versions of the PWM signal without losing any information. Using delayed versions of the PWM signal, a FIR filter is constructed for desired transfer function.

In some embodiments, the FIR filter includes a relatively high bandwidth operational amplifier acting as a summer and integrator. The FIR filter also includes a delay line with multiple delay line taps. Each unit delay of the delay line can be constructed synchronously using two counters or asynchronously using multiple transistors. A real-time analog signal is first converted to PWM format using a comparator and a triangle waveform generator. The frequency of the triangle waveform wave corresponds to a sampling rate in a comparable analog-to-digital converter. The PWM signal is passed through a tap delay line to form one or more delayed versions of the PWM signal which are needed for constructing the FIR filter. The PWM signal and the delayed versions of the PWM signal are scaled according to the coefficients of the FIR filter and then summed together to form a multi-level PWM signal. To remove the high frequency components of the resulting multi-level PWM signal, an integration function is also included in the summer which is based on a high bandwidth operation amplifier. The summing and integration circuit converts the multi-level PWM signal to an output analog signal.

Generation of the PWM signal is almost instantaneous, and therefore introduces little if any delay when converting the input analog signal to the PWM signal. Some delay may be introduced in converting the multi-level PWM signal to the output analog signal, the amount of delay depends on the time constant of the integrating circuit.

The mixed signal processing circuit utilizes the duty cycle as well as the amplitude of the PWM signals for addition and scaling to achieve filter realizations with mixed signal circuit components. Each PWM signal includes binary level information, the PWM signal is either high or low, where the amount of time the PWM signal is high during each period is the duty cycle. All the information in the binary level PWM signals is still present when added together as a multi-level PWM signal. The resulting multi-level PWM signal includes the duty cycle information and also the amplitude information that represents the value of the input analog signal.

In some embodiments, the summing and integration functionality is implemented using an operational amplifier. When used within a noise cancelling application, the operational amplifier is an inverting operational amplifier that generates an inverse analog signal based on the multi-level PWM signal input to the inverse operational amplifier.

FIG. 1 illustrates a simplified block diagram of an exemplary application of the mixed signal processing circuit within a noise cancellation headphone. The noise cancellation headphone 20 includes a microphone 22, a mixed signal processing circuit 24, an audio speaker 26, an audio device input port 28, an audio processing circuit 30, and a power source 32. The microphone 22 receives ambient noise and transmits the ambient noise as an input analog signal to the mixed signal processing circuit 24. The mixed signal processing circuit 24 processes the input analog signal to generate an inverse analog signal that is output to the audio speaker 26. The inverse analog signal is configured to substantially cancel the input analog signal. The audio device input port 28 is configured to interface with an external audio device that provides an audio signal for playback. The audio signal is received at the audio device input port 28 and output to the audio processing circuit 30, where the audio signal is processed and sent to the audio speaker 26 for playback. The power source 32 provides power to the components of the noise cancellation headphone 20.

Figure 2:
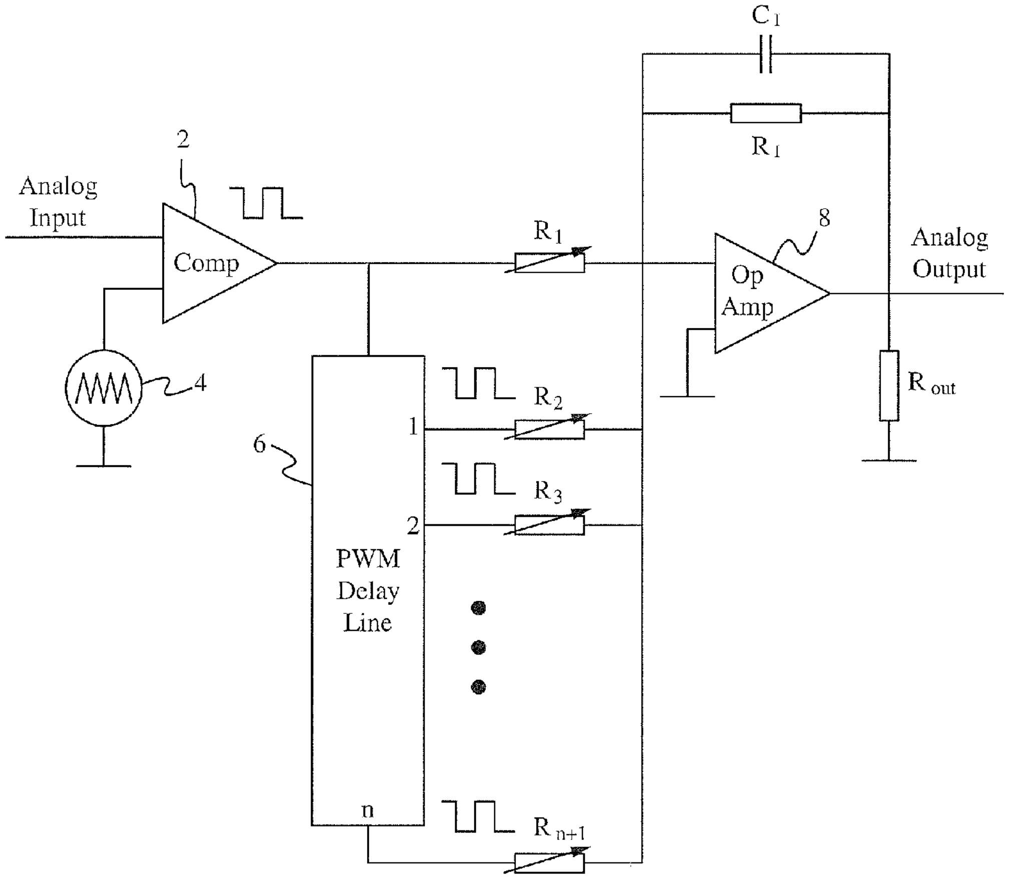
FIG. 2 illustrates a schematic diagram of a mixed signal processing circuit according to an embodiment.

FIG. 2 illustrates a schematic diagram of a mixed signal processing circuit according to an embodiment. An analog signal is input to a first input of a comparator 2. A triangle waveform is generated by a triangle waveform generator 2, and the triangle waveform is input to a second input of the comparator 2. The input analog signal is sampled using the triangle waveform, thereby converting the input analog signal to a pulse width modulating domain, referred to as a PWM signal. Each period of the PWM signal corresponds to a period of the modulating triangle waveform. The period of the triangle waveform over which the input analog signal is sampled is referred to as a sampling period. The magnitude of the input analog signal over the sampling period corresponds to the duty cycle of the PWM signal.

The comparator 2 is coupled to an FIR filter. In the exemplary configuration of FIG. 2, the FIR filter is implemented using a tapped delay line 6 and N delay line taps, where N is a positive integer of 1 or more, a resistive network including resistors R1 through Rn+1, and a summing and integration circuit including an operational amplifier 8, a capacitor CI, and a resistor R1. Each delay line tap delays the PWM signal by one period. At a given instant in time, each delay line tap outputs a different period of the PWM signal output from the comparator 2. The FIR filter also includes multiple output lines. A first output line is coupled to the comparator 2 such that the PWM signal is transmitted over the first output line without delay. Each delay line tap is coupled to one of the other output lines. In this manner, there are N+1 output lines including the first output line that is not subject to a delay and N output lines coupled to the N delay line taps. The first delay line tap outputs a first delayed PWM signal that is delayed by one period relative to the PWM signal on the first output line. The period by which the PWM signal is delayed corresponds to the sampling period such that each period of delay is the sampling period. The output of each successive delay line tap is delayed by an additional period. If, for example, there are 7 delay line taps, there are 8 total output lines including the first output line that is not delayed. The first output line outputs the PWM signal. The second output line outputs the PWM signal delayed by one period. The third output line outputs the PWM signal delayed by two periods. The fourth output line outputs the PWM signal delayed by three periods, and so on such that the eighth output line outputs the PWM signal delayed by seven periods.

Figure 3:
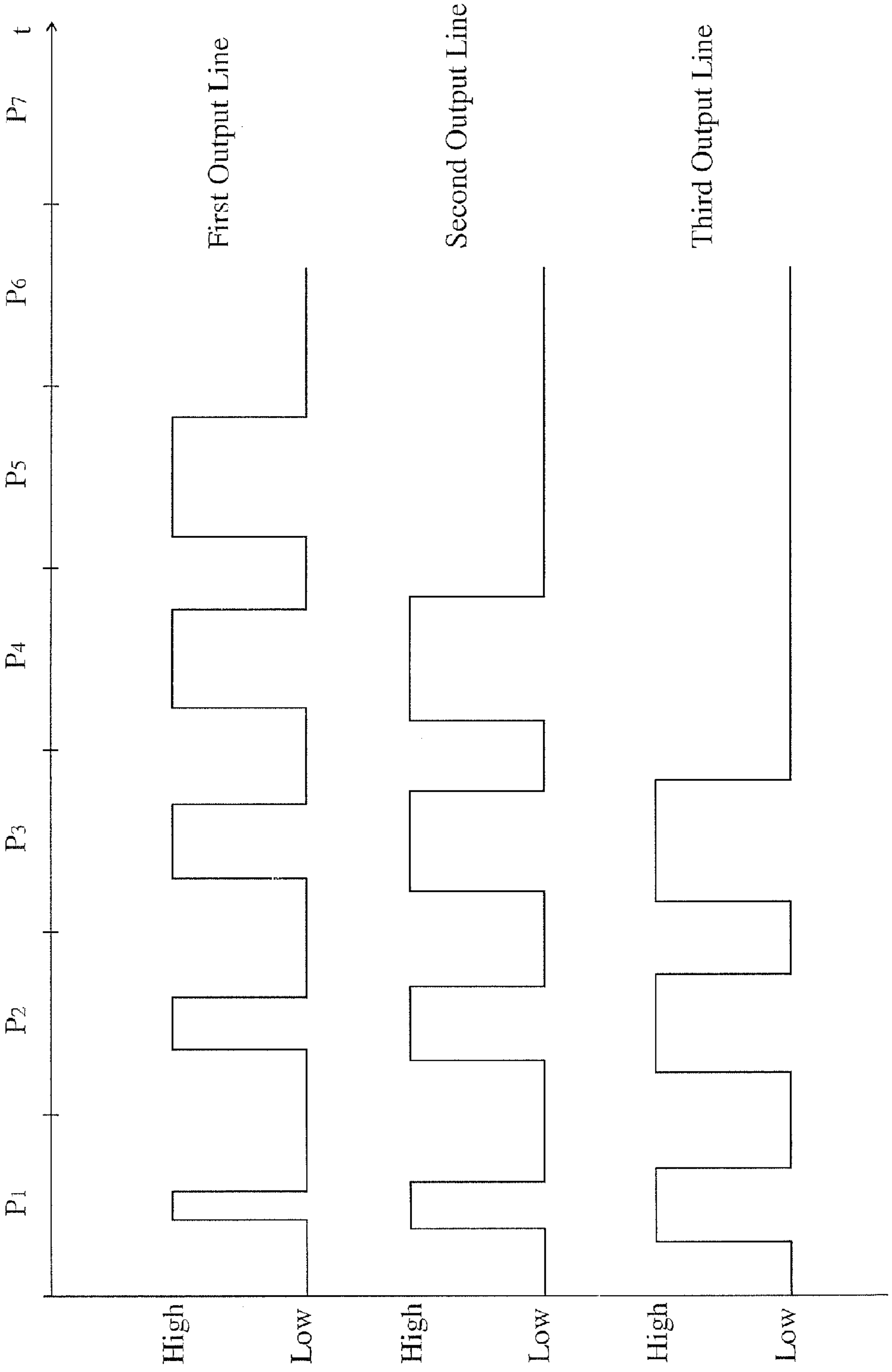
FIG. 3 illustrates a timing diagram of an exemplary PWM signal and two delayed versions of the PWM signal output over the first three output lines in FIG. 2.

FIG. 3 illustrates a timing diagram of an exemplary PWM signal and two delayed versions of the PWM signal output over the first three output lines in FIG. 2. The exemplary PWM signal is shown over 5 periods, P1 through P5, with the period P1 corresponding to the most recent time period. The PWM signal output over the first output line is not delayed and therefore corresponds in time to the PWM signal output from the comparator 2 and input to the resistor R1 in FIG. 2. The signal output over the second output line correspond to a first delayed PWM signal output from the first delay line tap and input to the resistor R2 in FIG. 2. The first delayed PWM signal is delayed by one period relative to the PWM signal output over the first output line. The signal output over the third output line correspond to a second delayed PWM signal output from the second delay line tap and input to the resistor R3 in FIG. 2. The second delayed PWM signal is delayed by one period relative to the first delayed PWM signal output over the second output line, and delayed by two periods relative to the PWM signal output over the first output line. The signals output over the remaining output lines in FIG. 2 are similarly delayed.

The PWM signals output on the N output lines are scaled using a resistive network. In the exemplary configuration of FIG. 2, the first output line is coupled to a variable resistor R1, the second output line is coupled to a variable resistor R2, the third output line is coupled to a variable resistor R3, and the N+1 output line is coupled to a variable resistor Rn+1. Although each of the variable resistors R1 through Rn+1 is shown in FIG. 2 as a single resistor, it is understood that each of the variable resistors R1 through Rn+1 represents one or more resistors. Each output line is coupled to a resistor for amplitude scaling.

The mixed signal processing circuit also includes a summing and integration circuit. Each of the variable resistors R1 through Rn+1 is coupled to the summing and integrating circuit. In the exemplary configuration shown in FIG. 2, the summing and integrating circuit includes the capacitor CI, the resistor R1, and the operation amplifier 8. A first input of the operational amplifier 8 is coupled to the variable resistors R through Rn+1. A second input of the operational amplifier 8 is coupled to ground. The capacitor CI and the resistor R1 are coupled in parallel to the first input and the output of the operational amplifier 8. An output resistor Rout is coupled to the output of the operational amplifier 8. The output of the operational amplifier 8 is an analog output signal, which is the output of the mixed signal processing circuit.

Figure 5:
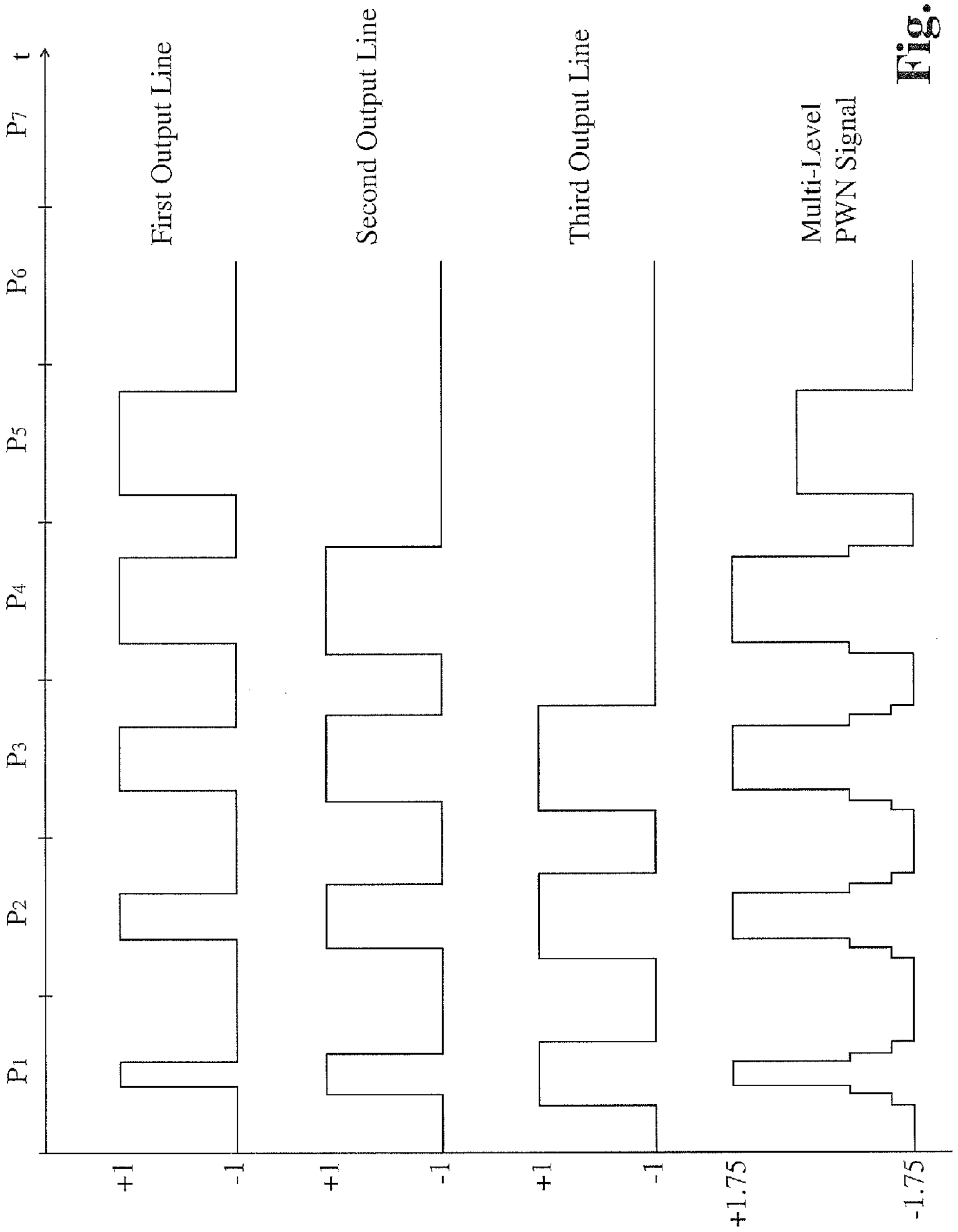
FIG. 5 illustrates the timing diagram of FIG. 3 and an exemplary multi-level PWM signal.

A scaled version of the PWM signal and scaled versions of the delayed PWM signals are used to generate a multi-level PWM signal, such as the multi-level PWM signal in FIG. 5. Each period of the multi-level PWM signal is a summation of the scaled versions of the corresponding sampling period for each of the PWM signal and the delayed versions of the PWM signal. For example, the period P1 of the multi-level PWM signal is a summation of the scaled PWM signal on the first output line for period P1, the scaled delayed PWM signal on the second output line for period P1, the scaled delayed PWM signal on the third output line for period P1, and so on for each additional output line. The "high" and "low" values of the PWM signals are represented in FIG. 5 as having magnitudes "+1" and "−1", respectively. The multi-level PWM signal is the summation of the three scaled PWM signals output on the first, second, and third output lines. In an exemplary application, the first PWM signal is scaled by a factor of "1", the second PWM signal is scaled by a factor of "0.5", and the third PWM signal is scaled by a factor of "0.25". The three scaled PWM signals are summed to form the multi-level PWM signal shown in FIG. 5.

The PWM tapped delay line, the output lines, the resistor network, and the summing and integration circuit form a FIR filter structure The value of each of the resistors is chosen to match a desired frequency response for the FIR filter. The scaling factor applied to each output line corresponds to one of the coefficients in the FIR filter design. Using variable resistors provides flexibility in design to meet arbitrary magnitude and phase requirements, thereby enabling programmability of the FIR filter.

In some embodiments, the operational amplifier includes summing circuits for adding each of the scaled PWM signals output from the variable resistors R1 through Rn+1, which forms the multi-level PWM signal. The amplitude and duty cycle information included in the multi-level PWM signal is used to generate the analog signal output from the operational amplifier.

The summation of the scaled PWM signals to form the multi-level PWM signal is a linear operation. In some embodiments, the summing and integration circuit is configured as a low pass filter. Since the summation in the operational amplifier is a linear operation, the low pass filter is included after the summation. However, in alternative configurations, the low pass filter can be positioned before the summation.

Figure 4:
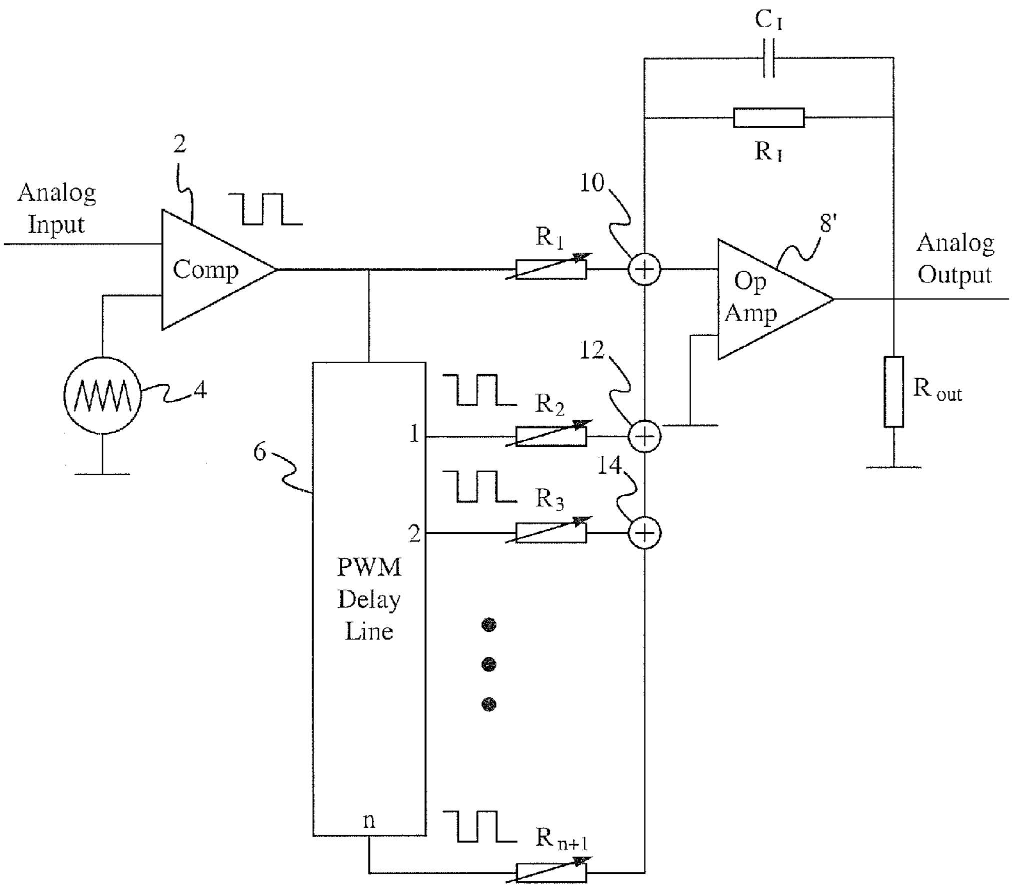
FIG. 4 illustrates the mixed signal processing circuit of FIG. 2 where summing circuits are coupled between the resistive network and the operational amplifier.

In other embodiments, the summing circuits are not included in the operational amplifier, and instead are coupled between the resistive network and the operational amplifier. FIG. 4 illustrates the mixed signal processing circuit of FIG. 2 where summing circuits 10, 12, and 14 are coupled between the resistive network and the operational amplifier.

In the exemplary application where the mixed signal processing circuit is used as part of a noise cancellation headphone, the input analog signal is ambient noise, and the operational amplifier is an inverting operational amplifier. In addition to converting the multi-level PWM signal to an analog signal, the inverting operational amplifier also inverts the multi-level PWM signal so that the output of the inverting operational amplifier is an inverted analog signal that substantially cancels out the input analog signal. Alternatively, the inverting functionality can be included within the scaling factors applied by the resistive network.

The multiplying function of the FIR filter is implemented in FIG. 2 using the variable resistors R1 through Rn+1. In general, the multiplying function can be implemented using any type of conventional multiplying circuitry that multiples the signal output from the comparator, or a delayed version of the signal output from one of the delay line taps, and a signal representative of the corresponding filtering coefficient used for scaling.

The mixed signal processing circuit described above is implemented using a FIR filter. Alternatively, similar principles can be applied using an infinite impulse response (IIR) filter.

The mixed signal processing circuit has been described in terms of specific embodiments incorporating details to facilitate the understanding of the principles of construction and operation of the mixed signal processing circuit. Such references, herein, to specific embodiments and details thereof are not intended to limit the scope of the claims appended hereto. It will be apparent to those skilled in the art that modifications can be made in the embodiments chosen for illustration without departing from the spirit and scope of the mixed signal processing circuit.

What is claimed is:

1. A signal processing circuit comprising:

a. a converting circuit configured to receive an input analog signal and to output a pulse width modulated signal corresponding to the analog signal;

b. a delay line coupled to the converting circuit to receive the pulse width modulated signal, wherein the delay line comprises one or more delay line taps, each delay line tap configured to output a delayed version of the pulse width modulated signal;

c. a scaling circuit coupled to the converting circuit and to the one or more delay line taps, where the scaling circuit is configured to scale the pulse width modulated signal and each of the one or more delayed versions of the pulse width modulated signal, thereby forming multiple scaled pulse width modulated signals; and d. a summing and integration circuit coupled to the scaling circuit, wherein the summing and integration circuit is configured to receive the multiple scaled pulse width modulated signals, to sum the multiple scaled pulse width modulated signals into a multiple-level pulse width modulated signal, and to convert the multiple-level pulse width modulated signal to an output analog signal.

2. The signal processing circuit of claim 1 wherein the converting circuit comprises a comparator and a triangle waveform generator, wherein the comparator is configured to compare the input analog signal and a triangle waveform received from the triangle waveform generator, and to output the pulse width modulated signal in response to the comparison.

3. The signal processing circuit of claim 2 wherein a period of the pulse width modulated signal corresponds to a period of the triangle waveform, and a duty cycle of a specific period of the pulse width modulated signal corresponds to an amplitude of the input analog signal during a same period of the triangle waveform.

4. The signal processing circuit of claim 3 wherein a first delayed version of the pulse width modulated signal output from a first delay line tap is delayed relative to the pulse width modulated signal by the period of the pulse width modulated signal, and each successive delayed version of the pulse width modulated signal output from each successive delay line tap is successively delayed by the period of the pulse width modulated signal.

5. The signal processing circuit of claim 1 wherein the scaling circuit comprises a resistor network.

6. The signal processing circuit of claim 1 wherein the summing and integrations circuit comprises an operational amplifier.

7. The signal processing circuit of claim 6 wherein the summing and integration circuit comprises one or more summing circuits.

8. The signal processing circuit of claim 1 wherein the delay line, the scaling circuit, and the summing and integration circuit form a finite impulse response filter.

9. The signal processing circuit of claim 8 wherein the finite impulse response filter is programmable.

10. The signal processing circuit of claim 1 wherein the signal processing circuit comprises a mixed signal processing circuit.

11. The signal processing circuit of claim 10 wherein the mixed signal processing circuit comprises a multi-level pulse width modulation signal processing circuit.

12. A noise cancellation headphone phone comprising:

a. a microphone configured to detect ambient noise and to generate an input analog signal corresponding to the ambient noise;

b. a signal processing circuit coupled to the microphone, wherein the signal processing circuit comprises:

i. a converting circuit configured to receive the input analog signal and to output a pulse width modulated signal corresponding to the analog signal;

ii. a delay line coupled to the converting circuit to receive the pulse width modulated signal, wherein the delay line comprises one or more delay line taps, each delay line tap configured to output a delayed version of the pulse width modulated signal;

iii. a scaling circuit coupled to the converting circuit and to the one or more delay line taps, where the scaling circuit is configured to scale the pulse width modulated signal and each of the one or more delayed versions of the pulse width modulated signal, thereby forming multiple scaled pulse width modulated signals; and iv. a summing and integration circuit coupled to the scaling circuit, wherein the summing and integration circuit is configured to receive the multiple scaled pulse width modulated signals, to sum the multiple scaled pulse width modulated signals into a multiple-level pulse width modulated signal, and to convert the multiple-level pulse width modulated signal to an output analog signal, wherein the output analog signal substantially cancels a portion of the input analog signal; and c. a speaker coupled to the signal processing circuit, wherein the speaker is configured to generate audio in response to the output analog signal.

13. A method of signal processing comprising:

a. receiving an input analog signal;

b. converting the analog signal to a pulse width modulated signal;

c. generating one or more time delayed versions of the pulse width modulated signal;

d. scaling the pulse width modulated signal and each of the one or more delayed versions of the pulse width modulated signal, thereby forming multiple scaled pulse width modulated signals;

e. summing the multiple scaled pulse width modulated signals to form a multiple-level pulse width modulated signal; and f. converting the multiple-level pulse width modulated signal to an output analog signal.

14. The method of claim 13 wherein converting the analog signal to the pulse width modulated signal comprises comparing the input analog signal and to a triangle waveform, and to generate the pulse width modulated signal in response to the comparison.

15. The method of claim 14 wherein a period of the pulse width modulated signal corresponds to a period of the triangle waveform, and a duty cycle of a specific period of the pulse width modulated signal corresponds to an amplitude of the input analog signal during a same period of the triangle waveform.

16. The method of claim 15 wherein a first delayed version of the pulse width modulated signal is delayed relative to the pulse width modulated signal by the period of the pulse width modulated signal, and each successive delayed version of the pulse width modulated signal is successively delayed by the period of the pulse width modulated signal.

17. The method of claim 13 wherein the scaling circuit comprises a resistor network.

18. The method of claim 13 wherein a scaling factor applied for scaling the pulse width modulated signal and each of the one or more delayed versions of the pulse width modulated signal is programmable.

19. The method of claim 13 wherein signal processing comprises mixed signal processing.

20. The method of claim 19 wherein the mixed signal processing comprises multi-level pulse width modulation processing.

* * * * *